(12) United States Patent
Wheeler et al.

(10) Patent No.: US 7,102,337 B2
(45) Date of Patent: Sep. 5, 2006

(54) FEEDBACK CIRCUIT FOR POWER SWITCHING CIRCUIT

(75) Inventors: Nicolas J. Wheeler, Manchester (GB); Philip Rutter, Stockport (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/536,244

(22) PCT Filed: Nov. 19, 2003

(86) PCT No.: PCT/IB03/05303

§ 371 (c)(1), (2), (4) Date: May 24, 2005

(87) PCT Pub. No.: WO2004/051832

PCT Pub. Date: Jun. 17, 2004

(65) Prior Publication Data
US 2006/0066288 A1 Mar. 30, 2006

(30) Foreign Application Priority Data
Nov. 29, 2002 (GB) .................. 0227790.3

(51) Int. Cl.
*G05F 1/618* (2006.01)

(52) U.S. Cl. .................. 323/282; 323/224; 323/225

(58) Field of Classification Search ........ 323/222–225, 323/282, 284, 285, 351
See application file for complete search history.

(56) References Cited

U.S. PATENT DOCUMENTS 6,166,528 A * 12/2000 Rossetti et al. ............. 323/283

FOREIGN PATENT DOCUMENTS

| EP | 0774827 A2 | 5/1997 |
|---|---|---|
| EP | 0774827 B1 | 5/1997 |
| EP | 0744827 A3 | 8/1998 |

* cited by examiner

*Primary Examiner*—Gary L Laxton

(57) ABSTRACT

A power switching circuit has high and low side switches (6, 8). The load-side FET (8) has a main body part (30) and a sense FET part (32). The current sensing circuit (32) measured the low side current. A capacitance (56) couples the switch node (10) to a current signal node (52) to provide a combined signal on current output (58), the combined signal including the low side current and timing information.

9 Claims, 2 Drawing Sheets

FEEDBACK CIRCUIT FOR POWER SWITCHING CIRCUIT

The invention relates to a feedback signal for a power switching circuit, a circuit for generating the signal and a method of operation of a power switching circuit.

FIG. 1 shows a buck converter having a control FET 6, a sync FET 8, and a switch node 10 between the control and sync FETs. The FETs are connected in series across power and ground inputs 2,4. The switch node 10 is connected through inductor 12 and across capacitor 14 to output 16 which may be connected to a load. A drive circuit 18 supplies control voltages to switch the FETs 6,8 on and off alternately. Diode 22 may be a body diode of the sync FET 8, or may alternately be a separate diode.

The condition in which both FETs conduct simultaneously is known as "shoot through" and is to be avoided since it results in a short between the input power 2 and ground 4 connections. Accordingly, in use, the drive circuit 18 switches on and off the FETs 6,8 alternately, switching on each FET a short time after the other FET is switched off to avoid both FETs conducting simultaneously. The current through inductor 12 is provided through diode 22 during the brief dead time in which both FETs 6, 8 are turned off.

The skilled person will be aware of many similar power switching circuits, including boost circuits and buck-boost circuits which may be employed instead.

Power switching circuits are used in a number of applications, including for example in voltage regulators to supply a voltage to a personal computer processor, or to provide a multiple phase power supply using a number of switching circuits one for each phase. Both of these applications, and others, require the drive circuit 18 to have information regarding the current flowing in the converter circuit. For example, in a personal computer processor a specific voltage-current profile may be required, and in a multi-phase power supply the phase currents in each phase may need to be balanced.

One control scheme for controlling the switches is a peak current mode control scheme in which the current in the upper switch must be measured. Unfortunately, in high frequency converters which use very short conduction pulses in the upper switch, such measurements become difficult due to the high level of switching noise and the limited time available for the sensing signal to settle.

Accordingly, there is a need for and improved approach for measuring the current in the switching circuits and providing a measurement signal to the drive circuit.

According to the invention there is provided a power switching circuit, comprising a high side switch and a low side switch arranged in series with a switch node therebetween; a current sensing circuit for sensing the current passing through the low side switch and providing a signal on a current signal node representing the current through the low side switch; and a capacitance coupling the switch node to the current signal node for coupling switching pulses indicating the switching times on the switch node onto the signal provided on the current signal node.

Thus, the power switching circuit provides a signal made up of a component representing the current through the low side switch and superposed on this signal pulses indicating the times that the switches switch.

The signal is obtained without the need to measure the current passing through the high side switch. Measurement of current in a high side switch is very difficult in high frequency switching circuits due to high levels of switching noise and the limited time available for the sensing signal to settle; the circuit according to the invention avoids this difficulty.

This signal is a single signal from which the current through the power switching circuit can be reconstructed.

The power switching circuit may be provided in a package separate from the drive circuitry—in this case the use of a single signal on the current signal node means that only one feedback terminal is needed for the current sense feedback on both the power switching circuit and the drive circuit. Since terminals represent a significant part of the cost of a package, this can represent a significant saving.

In a preferred embodiment the low side switch is a sense field effect transistor (hereinafter referred to as a "sense FET") having a gate input and sense and main outputs, the sense output being connected to the current signal node and the main output being connected to ground.

A sense FET is a FET that has a small sense area separate from the main body of the FET which provides a scaled down copy of the main sense current on a sense output. The sense output provides a convenient measure of the current through the FET.

To optimise the accuracy with which the sense output provides a measure of the current through the whole FET it is necessary that the voltages on the main body and sense area of the FET match. Accordingly, the power switching circuit may further comprise a feedback circuit for ensuring that the voltages on the outputs of the sense and main FETs match. The feedback circuit may include a feedback FET in series with the sense output; and a differential amplifier driving the gate of the feedback FET, the differential inputs of the differential amplifier being connected to the sense and main outputs of the sense FET. The differential amplifier and feedback FET operate as a feedback loop to force the source voltages of the main and sense FETs to be equal, thus ensuring that the ratio of the sense and main currents is equal to the ratio of the areas of the main and sense areas of the two MOSFETs.

In order to couple the current sensing node to the switch node a capacitor and a resistor in series may be provided between these nodes.

The invention also envisages a power conversion circuit comprising a power switching circuit as set out above, a current regeneration circuit having an input connected to the current signal node for regenerating a current signal from the information output by the current signal node of the power switching circuit; and a drive circuit having an input connected to the current regeneration circuit and outputs connected to the high side switch and the low side switch for switching the high and low side switches on alternately in accordance with the regenerated current signal.

In applications where a plurality of power outputs are required, there may be provided a plurality of power switching circuits, each being connected to a corresponding current regeneration circuit and a corresponding drive circuit.

In another aspect, the invention relates to a current feedback signal for signalling from a switching circuit having high and low side FETs to a drive circuit driving the switching circuit, the current feedback signal including a current signal corresponding to the instantaneous current through the low side FET when the low side FET is on and pulses superimposed on the current signal indicating the switching times of the FETs. The current signal is preferably a reducing signal.

In a further aspect, there is provided a method of operation of a power switching circuit having high and low side switches connected in series at a switch node, including:

switching the high and low side switches on alternately;

sensing the current through the low side switch and providing a current feedback signal corresponding to the sensed current; and capacitively coupling the switch node to the current feedback signal to provide switching pulses on the current feedback signal corresponding to the switching times of the switches.

For a better understanding of the invention, embodiments of the invention will now be described, purely by way of example, with reference to the accompanying drawings in which.

Figure 1:
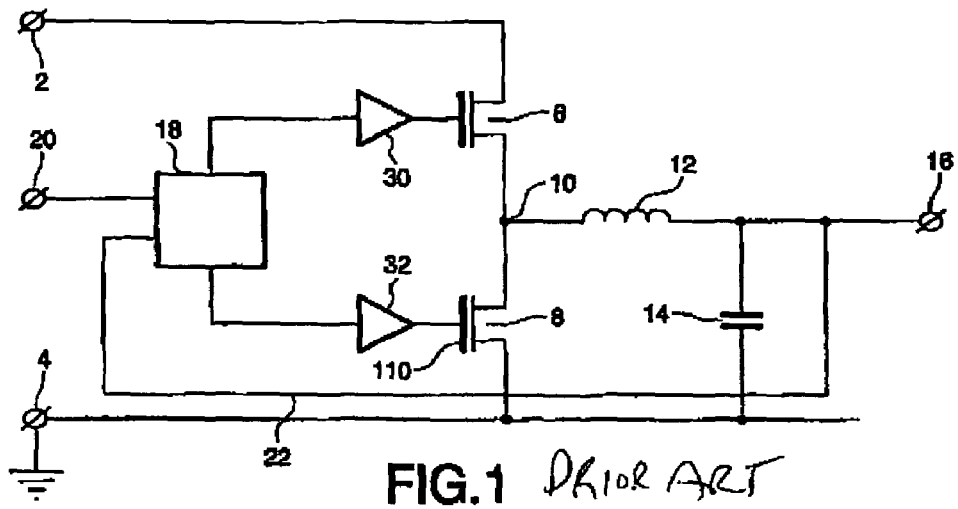
FIG. 1 shows a prior art buck converter circuit.
Figure 2:
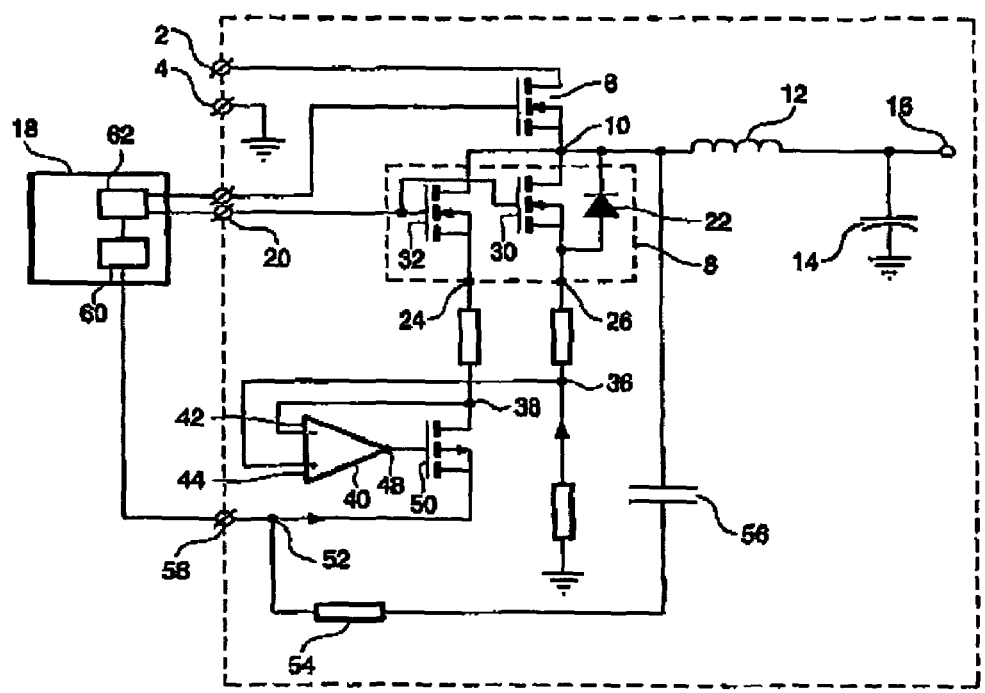
FIG. 2 shows a circuit according to a first embodiment of the invention.

FIGS. 3(a) to 3(d) show the signals in the circuit of FIG. 2; and

Figure 4:
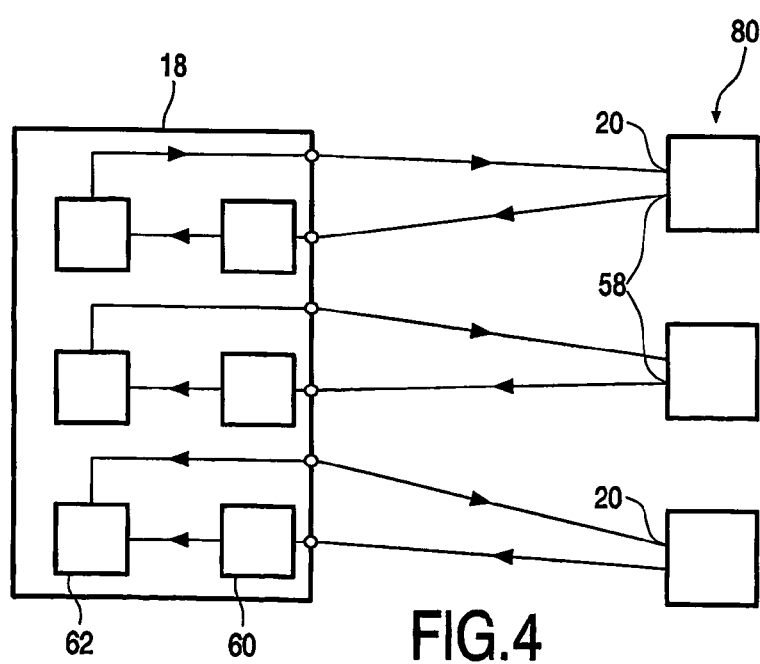

FIG. 4 shows a second embodiment of the invention.

Referring to FIG. 2, a high side FET 6 and a low side FET 8 are connected in series with a switch node 10 between the two. The switch node is connected to inductor 12 and through the inductor 12 to capacitance 14 and output node 16. Input power is provided on input terminals 2, 4.

In this arrangement, the low-side FET 8 is not a simple FET but is a sense FET having a main body part 30 and a sense FET part 32, the latter acting as a current sensing circuit. These are shown separately in FIG. 2 but are formed on the same substrate and are accordingly part of the same package. The gates of the main and sense FETs are connected together, and the same is true of the drains. The sources have separate outputs, sense output 24 and main output 26. The sense FET 8 also includes diode 22 which may conveniently be formed in the main body 30. The gate of high-side 6 and low-side 8 FETs are connected to control terminals 20.

Controller 18 is connected to control terminals 20 and provides drive signals to control the gates of the FETs 6, 8 to switch them on and off alternately.

The main source output 26 is connected to ground. The resistors shown are parasitic resistors in the wires.

Sense output 24 is connected to a current signal node 52 through a feedback circuit including a feedback FET 50 with its gate connected to the output 48 of an amplifier 40. The amplifier 40 has negative and positive differential inputs 42, 44 connected to nodes 38, 36 connected to the sense output 24 and the main output 26 respectively, in such a way that the sense output is connected to the negative differential input 42. The current signal node 52 is connected through resistor 54 and capacitor 56 to switch node 10. The current signal node is connected to output 58 of the power switching circuits, which is in turn connected to an input of a current regeneration circuit 60 in the controller 18. The current regeneration circuit 60 is in turn connected to driver circuit 62 which is connected to gate terminals 20 to drive the FETs 6, 8. Package 90 encloses the power switching circuit, as indicated schematically in FIG. 2.

Figure 3:
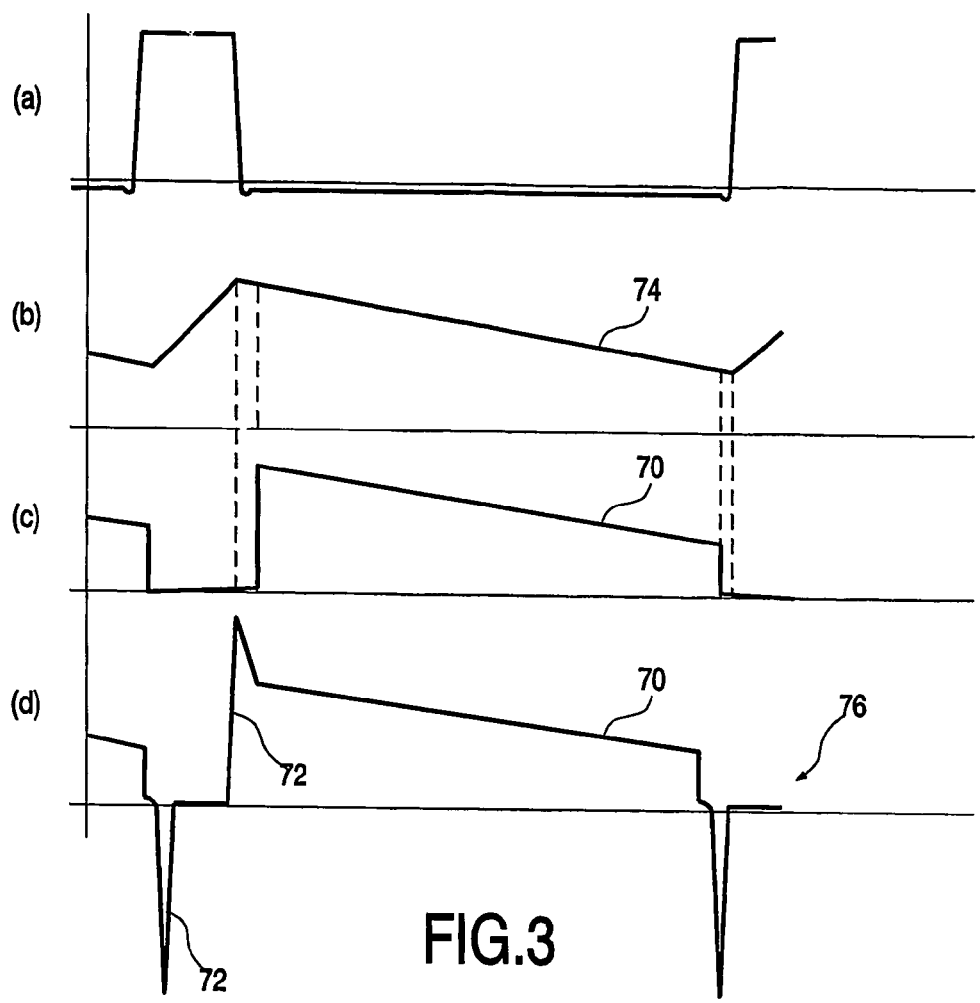

FIG. 3(a) shows the voltage on the switch node 10 and FIG. 3(b) the current 74 output through inductor 12 from switch node 10. FIG. 3(c) shows the current 70 output through sense output 24. Comparison of FIG. 3(b) and FIG. 3(c) reveals that the feedback current 70 of FIG. 3(c) substantially matches the output current 74 of FIG. 3(b) over much of the cycle. However, it does not match the output current when the low-side FET 8 is switched off. During most of the time that the low-side FET 8 is off, the high-side FET 6 is on and in this period the output current ramps upwards. However, between the time that the low-side FET is on and the time that the high-side FET 6 is on, there is short period during which diode 22 carries the current. Therefore, in order to recreate the shape of FIG. 3(b) from the information on FIG. 3(c), timing information as to the exact time that FET 6 switches off and diode 22 draws the current is also required.

In the approach of the invention, this additional information is provided through capacitor 56 which couples the switch node 10 to the current signal node 52. The rapidly changing voltage on switch node 10 as high-side FET 6 switches off causes a spike 72 to be added to the signal shown in FIG. 3(c) from sense FET 32 to provide the current feedback signal 76 shown in FIG. 3(d).

Current regeneration circuit 60 is able to recreate the shape of FIG. 3(b) from the information on a single signal 76 in the shape of FIG. 3(d) by extrapolation, and this information may then be used to control the switching of the FETs 6, 8.

The skilled person will be aware of different ways to achieve this goal. The current that is needed depends on the type of PWM controller 18 required by the application. Some applications may require the peak current i.e. when the syncFET is first switched on or the control FET is just switched off. Other applications may require the average current.

In a preferred approach to the regeneration circuit 60 a current mirror is used to mirror the sense current coming into the PWM controller 18. The mirrored current then passes through a resistor giving a voltage proportional to the current.

The timing signal information comes from comparators connected to the input signal, either directly at the input or the resistor giving the current.

To determine the peak current, the current regeneration circuit looks at the reconstituted signal and determines the slope of the current. By sampling the current at known times relative to the timing pulse the current regeneration circuit recreates the current when the sync FET was first turned on (i.e. where the signal is too dirty to actually sample).

This can be done fairly simply. A timing circuit is triggered by the switch signal at time T0. Then, the current is sampled at times T1 and T2 after the timing pulse at T0 (where T1−T0=T2−T1). The peak current is given by I(T0) =I(T1)+[I(T1)−I(T2)]=2*I(T1)−I(T2).

The calculation may be done digitally by inputting the voltage across the sense resistor to a DAC or by analogue methods. The skilled person will appreciate that the current can instead be sampled at different times requiring minor changes to the peak current calculation.

By using the arrangement according to the invention, only a single output signal is required to transmit two pieces of information, the feedback current measured on sense FET 32 and the timing information as to when FET 6 switches on and off. Moreover, the complete current information over the full cycle is available without the need to measure the current through high-side FET 6.

It will be noted that the feedback circuit constituted by amplifier 40 and FET 50 causes the voltages on nodes 38, 40 to match to ensure matching of the voltages on the sense FET 32 and the main FET 30.

Referring to FIG. 4, a plurality of switching circuits 80 may be provided connected to a single controller 18. Each switching circuit 80 has a single feedback output 58 connected to a corresponding current regeneration circuit 60 within controller 18. Thus, only one input per switching circuit 80 is required reducing the pin count needed for controller 18 compared with an arrangement where the output current and the timing information were provided on separate signal lines. Each switching circuit 80 is controlled by a corresponding driver circuit 62 connected to input 20 on the switching circuit 80.

From reading the present disclosure, other variations and modifications will be apparent to persons skilled in the art. Such variations and modifications may involve equivalent and other features which are already known in the design, manufacture and use of switching circuits and which may be used in addition to or instead of features described herein. Although claims have been formulated in this application to particular combinations of features, it should be understood that the scope of disclosure also includes any novel feature or any novel combination of features disclosed herein either explicitly or implicitly or any generalisation thereof, whether or not it mitigates any or all of the same technical problems as does the present invention. The applicants hereby give notice that new claims may be formulated to any such features and/or combinations of such features during the prosecution of the present application or of any further applications derived therefrom.

Although the current regeneration circuit 60 has been described as if it were a circuit, the skilled person will realize that such a circuit may be implemented in any of a combination of digital and analogue logic.

Furthermore, although the configuration described is that of a buck converter the invention is applicable to other types of switching converters as will be readily appreciated by the skilled person.

What is claimed is:

1. A power switching circuit, comprising:
   a high side switch (6) and a low side switch (8) arranged in series with a switch node (10) therebetween;
   a current sensing circuit (32) for sensing the current passing through the low side switch and providing a signal on a current signal node (52) representing the current through the low side switch; and
   a capacitance (56) coupling the switch node (10) to the current signal node (52) for coupling switching pulses on the switch node (10) onto the signal provided on the current signal node (52).

2. A power switching circuit according to claim 1 wherein the low side switch (8) is a sense field effect transistor (8) (sense FET) having a gate input (20) and sense (24) and main (26) outputs, the sense output (24) being connected to the current signal node (52).

3. A power switching circuit according to claim 2 further comprising a feedback circuit (40, 50) for ensuring that the voltages on the main and sense outputs match.

4. A power switching circuit according to claim 3 wherein the feedback circuit includes:
   a feedback FET (5) in series with the sense output; and
   a differential amplifier (40) having differential inputs (42, 44) and an output (48), the output (48) driving the gate of the feedback FET, the differential inputs (42, 44) of the differential amplifier being connected to the sense and main outputs (24, 26) of the sense FET.

5. A power switching circuit according to any proceeding claim wherein the current signal node (52)is connected to switch node (10) through a capacitor (56) and a resistor (54) in sense.

6. A power conversion circuit comprising
   a power switching circuit comprising:
   a high side switch and a low side switch arranged in series with a switch node therebetween;
   a current sensing circuit for sensing the current passing through the low side switch and providing a signal on a current signal node representing the current through the low side switch; and
   a capacitance coupling the switch node to the current signal node for coupling switching pulses on the switch node onto the signal provided on the current signal node; and
   a current regeneration circuit (60) having an input connected to the current signal node for regenerating a current signal from the information output by the current signal node fo the power switching circuit; and
   a drive circuit (62) having an input connected to the current regeneration circuit and outputs connected to the high side switch (6) and the low side switch (8) for switching the high and low side switches on alternately in accordance with the regenerated current signal.

7. A power conversion circuit according to claim 6 comprising a plurality of power switching circuits (80), said power switching circuits comprising:
   a high side switch and a low side switch arranged in series with a switch node therebetween;
   a current sensing circuit for sensing the current passing through the low side switch and providing a signal on a current signal node representing the current through the low side switch; and
   a capacitance coupling the switch node to the current signal node for coupling switching pulses on the switch node onto the signal provided on the current signal node, and each of the current switching circuits being connected to a corresponding current regeneration circuit (60) and a corresponding drive circuit (62) for switching the corresponding high and low side switches on alternately.

8. A power conversion circuit according to claim 6 in which the or each power switching circuit is provided in a respective package.

9. A method of operation of a power switching circuit having high (6) and low (8) side switches connected in series at a switch node (10) including:
   switching the high and low side switches (6, 8) on alternately;
   sensing the current through the low side switch (8) and providing a current feedback signal corresponding to the sensed current; and
   capacitively coupling (56, 54) the switch node to the current feedback signal to provide switching pulses (72) on the current feedback signal corresponding tote switching times of the switches (6, 8).

* * * * *